(12) United States Patent
Konrath et al.

(10) Patent No.: US 10,431,681 B2
(45) Date of Patent: Oct. 1, 2019

(54) SEMICONDUCTOR DEVICES AND A METHOD FOR FORMING A SEMICONDUCTOR DEVICE

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/486,460

(22) Filed: Apr. 13, 2017

(65) Prior Publication Data
US 2017/0301792 A1 Oct. 19, 2017

(30) Foreign Application Priority Data
Apr. 15, 2016 (DE) .................. 10 2016 106 967

(51) Int. Cl.
| | |
|---|---|
| *H01L 29/78* | (2006.01) |
| *H01L 21/308* | (2006.01) |
| *H01L 29/423* | (2006.01) |
| *H01L 29/66* | (2006.01) |

(52) U.S. Cl.
CPC ...... *H01L 29/7827* (2013.01); *H01L 21/3085* (2013.01); *H01L 21/3086* (2013.01); *H01L 29/4236* (2013.01); *H01L 29/66666* (2013.01); *H01L 29/66734* (2013.01); *H01L 29/7813* (2013.01)

(58) Field of Classification Search
CPC .................. H01L 21/3086; H01L 21/3088
See application file for complete search history.

(56) References Cited

U.S. PATENT DOCUMENTS

| | | | |
|---|---|---|---|
| 6,720,616 B2 | 4/2004 | Hirler et al. | |
| 2002/0031890 A1* | 3/2002 | Watanabe ......... | H01L 21/76224 438/296 |
| 2009/0269896 A1 | 10/2009 | Chen et al. | |
| 2012/0190204 A1* | 7/2012 | Graves-Abe ........ | H01L 21/3086 438/702 |
| 2013/0307061 A1 | 11/2013 | Masuda et al. | |
| 2014/0284615 A1 | 9/2014 | Mauder et al. | |
| 2015/0179737 A1 | 6/2015 | Schulze et al. | |

\* cited by examiner

*Primary Examiner* — Seahvosh Nikmanesh
(74) *Attorney, Agent, or Firm* — Murphy, Bilak & Homiller, PLLC

(57) ABSTRACT

A semiconductor device includes a gate trench of at least one transistor structure extending into a semiconductor substrate. The gate trench includes at least one sidewall having a bevel portion located adjacent to a bottom of the gate trench. The at least one sidewall of the gate trench is formed by the semiconductor substrate. An angle between the bevel portion and a lateral surface of the semiconductor substrate is between 110' and 160°. A lateral dimension of the bevel portion is larger than 50 nm. Methods for forming the semiconductor device are also provided.

12 Claims, 5 Drawing Sheets

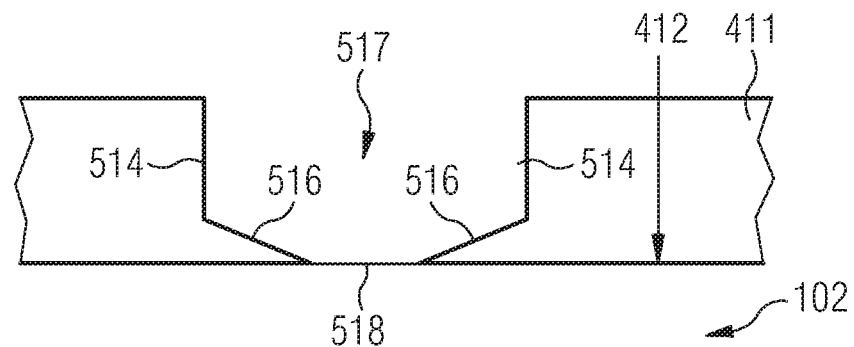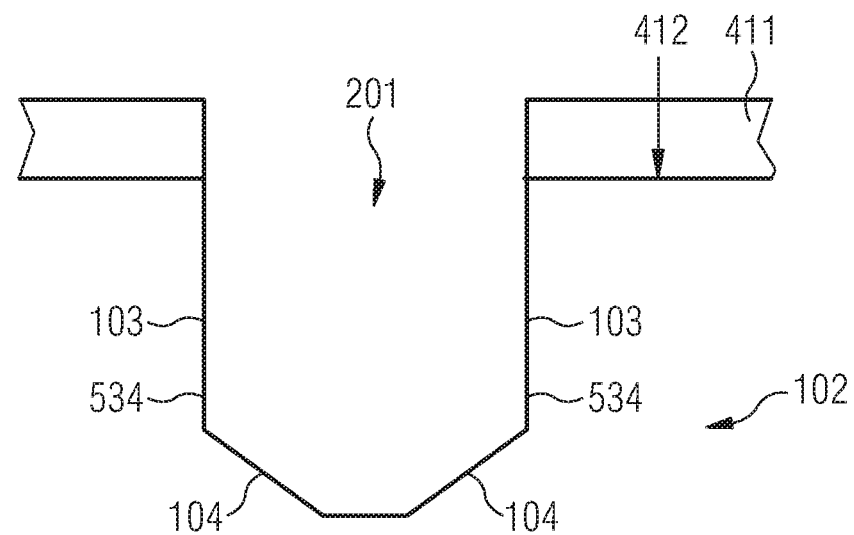

SEMICONDUCTOR DEVICES AND A METHOD FOR FORMING A SEMICONDUCTOR DEVICE

TECHNICAL FIELD

Embodiments relate to concepts for forming trenches in semiconductor substrates and in particular to semiconductor devices and a method for forming a semiconductor device.

BACKGROUND

In the manufacture of power MOSFETs and IGRIs with inversion channels at trench walls, the electric field strength at the edges of the trenches may need to be limited in order not to strain the gate oxide beyond its limits. Some approaches may be to shield the electric field using field plates or using additional p-doped regions in the area of the trench edges. However, these approaches may introduce additional capacities due to the field plates additional capacitances may be formed between the field plate and gate Ciss and/or between the field plate and the drain Crss). In addition, these approaches may lead to the formation of a JHET channel which may lead to an increase of a resistance between the drain and the source, for example.

SUMMARY

It is a demand to provide concepts for semiconductor devices with improved robustness against high electric fields.

Some embodiments relate to a semiconductor device. The semiconductor device comprises a gate trench of at least one transistor structure extending into a semiconductor substrate. The gate trench comprises at least one sidewall comprising a bevel portion located adjacent to a bottom of the gate trench. An angle between the bevel portion and the bottom of the trench lies between 110° and 160°. A lateral dimension of the bevel portion is larger than 50 nm.

Some embodiments relate to a further semiconductor device. The semiconductor device comprises a trench formed in an active region of a semiconductor substrate. The trench comprises at least one sidewall comprising a bevel portion located adjacent to a bottom of the trench. An angle between the bevel portion and the bottom of the trench lies between 110° and 160°. A lateral dimension of the bevel portion is larger than 50 nm.

Some embodiments relate to a method for forming a semiconductor device. The method comprises structuring a mask layer formed at a semiconductor substrate to form an opening in the mask layer. The opening comprises a mask bevel edge. The method further comprises etching at least a part of the mask layer and the semiconductor substrate during the same etching process to form a trench extending into the semiconductor substrate. The trench comprises a width of less than 10 μm. A sidewall of the trench formed by the etching process comprises a bevel portion based on a reproduction of the mask bevel edge of the mask layer in the semiconductor substrate.

BRIEF DESCRIPTION OF THE FIGURES

Some embodiments of apparatuses and/or methods will be described in the following by way of example only, and with reference to the accompanying figures, in which:

FIGS. 5A to 5D show schematic illustrations of a method for forming a semiconductor device by forming a first trench and a second trench in a mask layer.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
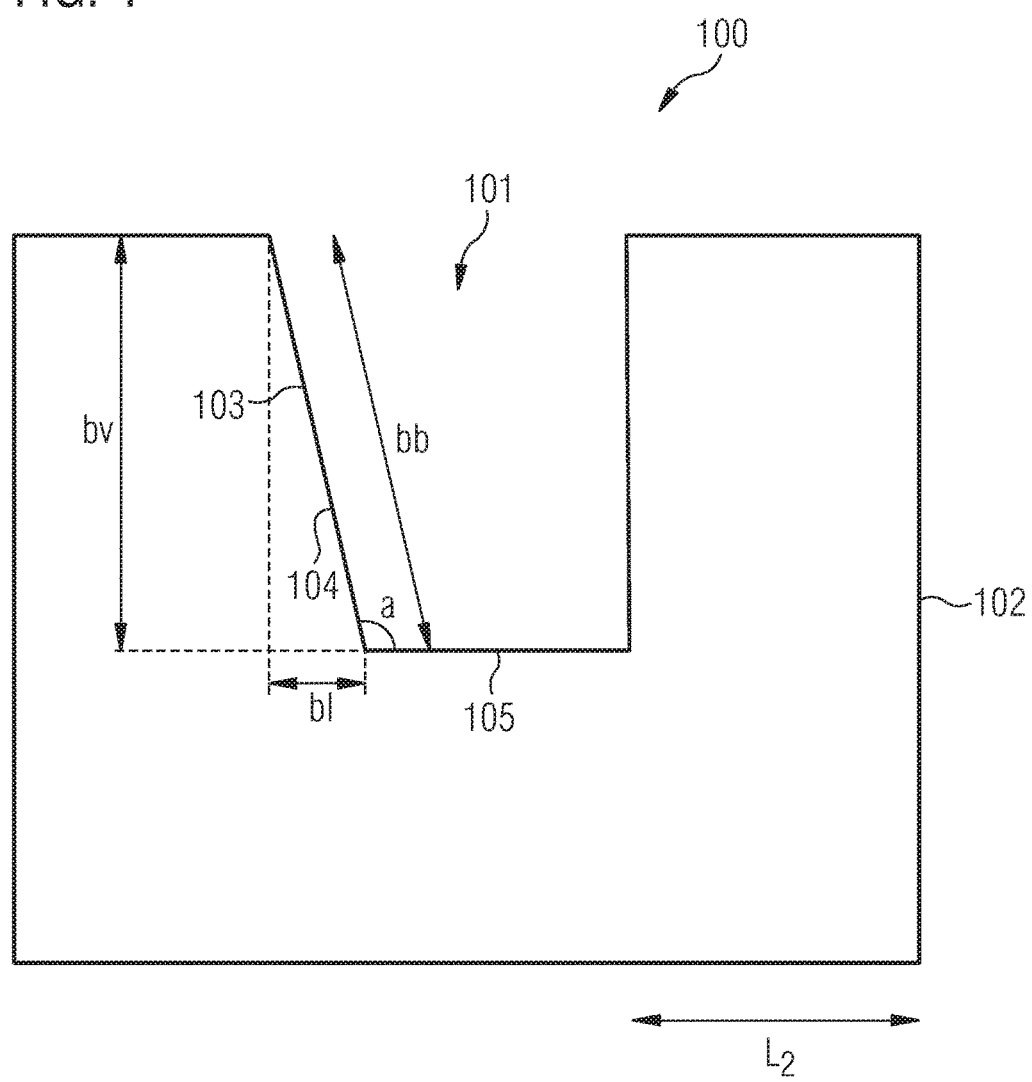
FIG. 1 shows a schematic illustration of a semiconductor device.

FIG. 1 shows a schematic illustration of a cross-section of a semiconductor device 100.

The semiconductor device 100 comprises a gate trench 101 of at least one transistor structure extending into a semiconductor substrate 102. The gate trench 101 comprises at least one sidewall 103 comprising a bevel portion 104 located adjacent to a bottom 105 of the gate trench 101. An angle, a, between the bevel portion 104 and the bottom 105 of the gate trench 101 lies between 110° and 160°. A lateral dimension, hl, of the bevel portion 104 is larger than 50 nm.

Due to the angle between the bevel portion 104 and the bottom 105 of the gate trench 101 lying between 110° and 160°, and the lateral dimension of the bevel portion 105 being larger than 50 nm, an electric field strength at the gate trench may be reduced. For example, peaks of the electric field and/or weaknesses of the gate oxide at edges of the gate trench may be reduced. Thus, a gate oxide formed in the gate trench may be prevented from being strained beyond its limits, for example. Thus, the semiconductor device 100 may be more robust against high electric fields, for example.

The angle, a, between the bevel portion 104 and the bottom 105 of the gate trench 101 may be an angle between an approximated line of fitting of the bevel portion 104 and the bottom 105 of the gate trench 101 (or e.g. an approximated line of fitting of the bottom 105 of the gate trench 101), for example. The angle, a, between the bevel portion 104 and the bottom 105 of the gate trench 101 lies between 110° and 160° (or e.g. between 120° and 150°, or e.g. between 130° and 140°), for example.

The approximate line of fitting of the bevel portion 104 may be a line of best fit or a line of fitting based on the surface roughness of the surface of the bevel portion 104 in a cross-section of the gate trench 101. For example, the approximate line of fitting of the bevel portion 104 may be a line of best fit or a line of fitting determined by the method of at least squares based on variations or deviations of (or along) the surface of the bevel portion 104, for example.

The bevel portion 104 may have a substantially planar (or e.g. straight) or flat surface neglecting a surface roughness caused by processes for forming the gate trench 101, for example. For example, a maximum deviation of the surface of the bevel portion 104 (over more than 95%, or e.g. over more than 99%, or e.g. over the whole bevel portion 104) from the approximated line of fitting of the bevel portion 104 may be less than 5 nm (or less than 3 nm, or e.g. less than 1 nm), for example.

The approximate line of fitting of the bottom 105 of the gate trench 101 may be a line of best fit or a line of fitting based on the surface roughness of the bottom 104 of the gate trench 101 in the cross-section of the gate trench 101. For example, the approximate line of fitting of the bevel portion may be a line of best fit or a line of fitting determined by the method of at least squares based on variations or deviations of a surface of the bottom 104 of the gate trench 101, for example. The approximate line of fitting of the bottom 105 of the gate trench 101 may be substantially parallel to the first lateral surface of the semiconductor substrate 102, for example. For example, the approximate line of fitting of the bottom 105 of the gate trench 101 may deviate from the lateral direction of the first lateral surface of the semiconductor substrate 102 by an angle of between 0° and 10° (or e.g. between 0° and 5°, or e.g. between 0° and 1°), for example.

The bottom 105 of the gate trench 101 may have a substantially planar (or e.g. straight) or flat surface neglecting a surface roughness caused by processes for forming the gate trench 101, for example. For example, a maximum deviation of the surface of the bottom 105 of the gate trench 101 (over more than 95%, or e.g. over more than 99%, or e.g. over the bottom 105 of the gate trench) from the approximated line of fitting of the bottom of the gate trench 101 may be less than 5 nm (or e.g. less than 3 nm, or e.g. less than 1 nm), for example.

A minimum bevel dimension, bb, of the bevel portion 104 (in a cross section of the semiconductor substrate perpendicular (or orthogonal) to the length of the gate trench), may be a smallest distance measured between a first edge of the bevel portion 104 and a second edge of the bevel portion 104 in a direction parallel to the surface of the bevel portion 104 (or e.g. in a direction parallel to the approximated line of fitting of the bevel portion 104). The first edge of the bevel portion 104 may be a point of the bevel portion 104 located at the bottom 105 of the gate trench 101 (or e.g. may be a bottom or deepest point of the bevel portion 104, or e.g. may be a point of the bevel portion 104 farther from the first lateral surface of the semiconductor substrate 102). The second edge of the bevel portion 104 may be a point of the bevel portion 104 located at the first lateral surface of the semiconductor substrate (or e.g. may be a top or highest point of the bevel portion 104, or e.g. may be a point of the bevel portion 104 closest to the first lateral surface of the semiconductor substrate 102)

The bevel portion 104 of the sidewall 103 may have lateral length extending in the first lateral direction, L1, or e.g. orthogonal to the cross section schematic illustration show in FIG. 1. The bevel portion 104 of the sidewall 103 may further have lateral width (e.g. a minimum lateral dimension), b1 extending in the second lateral direction, L2 orthogonal to the first lateral direction, L1 in parallel to the first lateral surface of the semiconductor substrate 102.

The lateral width or, e.g. the minimum (or smallest) lateral dimension, b1, of the bevel portion 104 may be distance between a first edge of the bevel portion 104 and a second edge of the bevel portion 104 measured in a direction substantially parallel to the first lateral surface of the semiconductor substrate 102 (e.g. in the second lateral direction, L2). The lateral width, b1, of the bevel portion 104 is larger than 50 nm (or e.g. larger than 100 nm, or e.g. larger than 200 nm) over more than 95%, or e.g. more than 99% of the lateral length of the gate trench, for example. For example, the lateral width, b1, of the bevel portion 104 may lie between 50 nm and 1 μm (or e.g. between 50 nm and 600 nm, or e.g. between 50 nm and 300 nm, or e.g. between 100 nm and 200 nm), for example.

The bevel portion 104 of the sidewall 103 may extend in the first lateral direction, L1 farther than in the orthogonal second lateral direction, L2, for example. For example, the lateral length of the bevel portion 104 may be more than 10× (or more than 50× or more than 100×) larger than the lateral width (in the second lateral direction, L2) of the bevel portion 104, for example.

The minimum (or smallest) vertical dimension, by, of the bevel portion 104 may be distance between the first edge of the bevel portion 104 and the second edge of the bevel portion 104 measured in direction substantially perpendicular (or orthogonal) to the first lateral surface of the semiconductor substrate 102 (e.g. in the vertical direction).

The bevel dimension, bb, of the bevel portion 104 may be related to the vertical dimension of the bevel portion 104 and the lateral width of the bevel portion 104 in accordance with the Pythagoras theorem of triangles, for example. For example, the bevel dimension of the bevel portion 104 may be hypotenuse of an imaginary triangle having a height equal to the vertical dimension of the bevel portion 104 and a base length equal to the lateral width of the bevel portion 104, for example.

Optionally, the bevel portion 104 of the at least one sidewall 103 may extend from the bottom of the gate trench 101 to a first lateral surface of the semiconductor substrate 102, for example. For example, the bevel portion 104 of a sidewall 103 may be (or may include) the entire (or whole) sidewall 103, for example. For example, the vertical dimension (or height) of the bevel portion 104 may be equal to a maximum (or largest) depth of the gate trench 101, for example.

Alternatively, the minimum (or smallest) vertical dimension (or height), by, of the bevel portion of the at least one sidewall 103 may be less than 50% (or e.g. or e.g. less than 40%, or e.g. less than 30%) of the maximum depth of the gate trench 101. For example, the bevel portion of the at least one sidewall 103 may extend from the bottom 105 of the gate trench to a vertical dimension of less than 50% (or e.g. less than 40%, or e.g. less than 30%) of the maximum depth of the gate trench.

The maximwn depth of the gate trench may be the largest distance between a surface level of the first lateral surface of the semiconductor substrate 102 and a bottom 105 of the gate trench 101 measured in a direction substantially orthogonal to the first lateral surface of the semiconductor substrate, for example. A maximum depth of the gate trench may be less than 10 μm (or e.g. less than 8 μm, or e.g. less than 5 μm.)

The at least one sidewall 103 may include a (substantially) vertical portion located between the first lateral surface of the semiconductor substrate 102 and the bevel portion 104 of the at least one sidewall 103. An angle between the vertical portion of the at least one sidewall 103 and the first lateral surface of the semiconductor substrate may lie between 80° and 100° (or e.g. between 85° and 95°, or e.g. between 89° and 91°, or e.g. may be 90°).

Optionally or additionally, the lateral width, b1, of the bevel portion 104 of the at least one sidewall 103 may be less than 50% (or e.g. less than 40%, or e.g. less than 30%) of a lateral width (e.g. trench width) of the gate trench 101 at the first lateral surface of the semiconductor substrate.

The lateral width of the gate trench 101 at the first lateral surface of the semiconductor substrate 102 may be a distance between a first sidewall of the gate trench 101 and a second opposite sidewall of the gate trench 101 at the first lateral surface of the semiconductor substrate measured in a direction substantially parallel to the first lateral surface of the semiconductor substrate 102 (e.g. in the second lateral direction). For example, the width of the gate trench may be minimum lateral dimension of the gate trench 101 at the first lateral surface of the semiconductor substrate 102 measured in a direction substantially parallel to the first lateral surface of the semiconductor substrate 102 (e.g. in the second lateral direction).

The lateral width of the gate trench 101 at the first lateral surface of the semiconductor substrate 102 may be less than 10 μm (or e.g. less than 8 μm, or e.g. less than 5 μm, or e.g. less than 4 μm, or e.g. less than 3 μm), for example.

The gate trench 101 may include the first sidewall 103 comprising the bevel portion located adjacent to (e.g. directly adjacent to, or e.g. directly abutting, or e.g. directly connected to) the bottom 105 of the gate trench 101.

The gate trench 101 may include an opposite second sidewall. The second sidewall may extend substantially vertically from a surface of the semiconductor substrate 102 to a bottom 105 of the gate trench 101. For example, an angle between the substantially vertical second sidewall and the first lateral surface of the semiconductor substrate 102 may lie between 80° and 100° (or e.g. between 85° and 95°, or e.g. between 89° and 91°, or e.g. may be 90°). For example, only one sidewall (e.g. the first sidewall 103) of the gate trench 102 comprises a bevel portion 104 located adjacent to the bottom 105 of the gate trench 101. For example, the vertical second sidewall does not include a bevel portion, for example. For example, more than 90% (or e.g. more than 95%, or e.g. more than 99%) of the vertical second sidewall may extend vertically, for example.

Optionally or alternatively, the second sidewall (instead of being a vertical sidewall) may include a bevel portion located adjacent to (e.g. directly adjacent to, or e.g. directly abutting, or e.g. directly connected to) the bottom 105 of the gate trench 101. For example, the bevel portion of the second sidewall may be identical (e.g. may include one or more or all of the features of the bevel portion of the first sidewall. Additionally, the bevel portion of the second sidewall may be symmetrically opposite to the bevel portion of the first sidewall about a middle line or plane of symmetry extending perpendicularly through the middle of the lateral width of the gate trench 101, for example.

The semiconductor device to be formed may be a metal oxide semiconductor field effect transistor (MOSFET) device, an insulated gate bipolar transistor (IGBT) device or a metal oxide semiconductor (MOS) gate diode (MGD) transistor device. For example, the at least one transistor structure may be at least one MOSFET transistor structure, at least one IGBT transistor structure, or e.g. at least one MGD transistor structure, for example.

Each MOSFET structure or IGBT structure may include a source or emitter region having a first conductivity type (e.g. n+ doped), a body region having a second conductivity type (e.g. p-type doped) and a drift region (e.g. n-type doped), for example. At least the body region of the transistor structure may be located adjacent to the gate trench 101, for example. Each MGD transistor structure may include an anode region or a cathode region located adjacent to the gate trench 101.

The semiconductor device 100 may include a gate insulation layer and a gate electrode located in the gate trench 101. The gate insulation layer may be formed on the first sidewall (e.g. on the bevel portion 104 and/or on the vertical portion) and on the second sidewall of the gate trench 101 and/or at the bottom of the gate trench 101, for example. The gate insulation layer may be located between the gate electrode and a sidewall of the gate trench 101 of the semiconductor substrate 102, for example.

Optionally, in the case of only one sidewall 103 of the gate trench 102 comprising a bevel portion 104, a body region of a transistor structure (to be controllable or switchable by the gate electrode located in the gate trench 101) may be located in the semiconductor substrate 102 adjacent to the (first) sidewall 103 of the gate trench 101 having the bevel portion 104. For example, a body region, a source region and a drift region of the transistor structure may be located adjacent to the (first) sidewall 103 having the bevel portion 104. Optionally, the opposite vertical second sidewall having no bevel portion 104 may be free from a transistor structure. For example, no switchable or controllable transistor structure may be located adjacent to the opposite vertical second sidewall. For example, no body region (and/or e.g. no source region) of a transistor structure may be located adjacent to the opposite vertical second sidewall. Alternatively or optionally, a first transistor structure (e.g. a body region of the first transistor structure) may be located in the semiconductor substrate adjacent to the first sidewall 103 having the bevel portion 104, and a second transistor structure (e.g. a body region of the second transistor structure) may be located in the semiconductor substrate adjacent to the opposite second sidewall 103 having no bevel portion 104, for example.

In the case of the opposite second sidewall also including a bevel portion 104, a first transistor structure (e.g. a body region of the transistor structure) may be located in the semiconductor substrate adjacent to the first sidewall 103 having the bevel portion, and a second transistor structure (e.g. a body region of the second transistor structure) may be located in the semiconductor substrate adjacent to the opposite second sidewall 103 having the bevel portion, for example.

In the case of the sidewall 103 including a substantially vertical portion located between the first lateral surface of the semiconductor substrate 102 and the bevel portion 104 of the sidewall, the bevel portion 104 of the sidewall 103 of the gate trench 101 may be located deeper in the semiconductor substrate 102 than a maximum (or deepest) depth of the body region at the sidewall 103 of the gate trench 101. For example, a portion of the body region adjacent to the sidewall of the gate trench may be adjacent to the vertical portion of the sidewall 103 of the gate trench 101 but does not vertically overlap the bevel portion of the sidewall of the gate trench. For example, a maximum depth of the body region at the sidewall 103 of the gate trench 101 may be smaller (or shallower) than a depth of the bevel portion 104 of the sidewall 103 of the gate trench 101, for example.

Additionally or optionally, the bevel portion 104 of the sidewall 103 of the gate trench 101 may be laterally adjacent to a drift region of the at least one transistor. For example, the bevel portion 104 of the gate trench 101 may extend vertically into the drift region towards the drain or collector region located at the second lateral side (back side surface) of the semiconductor substrate 102. Optionally, the bevel portion 104 of the gate trench may extend into the drift region by greater or larger than 1% (or e.g. larger than 3%, or e.g. larger than 5%, or e.g. larger than 10%, or e.g. larger than 20%, or e.g. larger than 30%) of a vertical dimension of the drift region. For example, a silicon substrate may have a smaller relative trench depth because the drift region may be very thick. A wide band gap semiconductor substrate may have a large relative trench depth because the thickness of the drift region may be an order of magnitude smaller than that of silicon, for example.

The gate trench 101 may be one of a plurality of gate trenches 101 extending vertically into the semiconductor substrate from the first lateral surface (or front surface) of the semiconductor substrate. The plurality of gate trenches 101 may have a vertical extension (e.g. a vertical depth). For example, the plurality of gate trenches 101 may be laminar structures or may have the geometry of walls or plates. In a cross-section orthogonal to the lateral length (or the first lateral direction) of the stripe-shaped gate trenches, the stripe-shaped gate trenches may have a pillar shape, for example. The plurality of gate trenches 101 may be striped-shaped, and may be arranged substantially in parallel to each other (e.g. neglecting manufacturing tolerances) in the semiconductor substrate. Each gate trench of the plurality of gate trenches 101 may include sidewalls (e.g. the first sidewall and the opposite second sidewall) extending into the semiconductor substrate and a trench bottom connecting the sidewalls of the gate trench, for example.

The plurality of gate trenches 101 may have a stripe-shape in a top view of the semiconductor device. A stripe-shape may be a geometry extending in a first lateral direction, L1, significantly farther than in an orthogonal second lateral direction, L2. For example, each gate trench of the plurality of gate trenches may comprise a lateral length (in the first lateral direction, L1) of more than 10× (or more than 50× or more than 100×) a minimum lateral width (in the second lateral direction, L2) of the gate trench, for example. The lateral length of the gate trench 101 may be the largest lateral dimension or largest extension along (or parallel to) a lateral surface of the semiconductor substrate. The lateral width of the gate trench at the first lateral surface of the semiconductor substrate may be a minimum lateral dimension of the gate trench at the first lateral surface of the semiconductor substrate extending along (or parallel to) the surface of the semiconductor substrate. The lateral width of each gate trench at the first lateral surface of the semiconductor substrate may be the same or may vary by less than +/−5% (or e.g. less than +/−2%, or e.g. less than +/−1%) over more than 95%, or e.g. more than 99% of the lateral length of the gate trench.

All the gate trenches of the plurality of gate trenches 101 may have the same lateral length and/or the same lateral width at the first lateral surface of the semiconductor substrate, for example. Alternatively, the lateral length and/or the lateral width of the plurality of gate trenches may differ at least partly from each other. Optionally, all the gate trenches of the plurality of gate trenches 101 may have identical geometries and/or lateral dimensions, for example.

The vertical extension (or depth) of the plurality of gate trenches may be smaller (or e.g. shorter) than the lateral length of each gate trench of the plurality of gate trenches, for example. For example, the minimum (or smallest) vertical extension of the plurality of gate trenches (or each gate trench) from the first lateral surface of the semiconductor substrate into the semiconductor substrate may be more than 1 µm (or e.g. more than 5 µm, or e.g. more than 10 µm, or e.g. more than 20 µm).

The semiconductor substrate may be a silicon substrate or may be wide band gap semiconductor substrate having a band gap larger than the band gap of silicon (1.1 eV). For example, the semiconductor substrate may be a silicon carbide (SiC)-based semiconductor substrate, or gallium arsenide (GaAs)-based semiconductor substrate, or a gallium nitride (GaN)-based semiconductor substrate. The semiconductor substrate may be a semiconductor wafer or a semiconductor die.

The semiconductor device to be manufactured may be a power semiconductor device. A power semiconductor device or an electrical structure e.g. transistor structure or diode structure) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

In the case of the semiconductor device including a MOSFET transistor structure or an IGBT transistor structure, each MOSFET or IGBT transistor structure may include a source or emitter region having a first conductivity type (e.g. n+ or n++ doped), a body region having a second conductivity type (e.g. p-type doped) and a drift region (e.g. n-type doped).

In the case of the semiconductor device including a MOSFET transistor structure, a drift region of the MOSFET transistor structure may be located between a body region of the MOSFET transistor structure and a drain region of the MOSFET transistor structure located at a second lateral side (e.g. a back side surface) of the semiconductor substrate. The drain region of the MOSFET transistor structure may have the first conductivity type (e.g. n+ or n++ doped), for example.

In the case of the semiconductor device including an IGBT transistor structure, the drift region of the IGBT transistor structure may be located between a body region of the IGBT transistor structure and a collector region of the IGBT transistor structure located at the second lateral side (e.g. a back side surface) of the semiconductor substrate. The second collector region of the IGBT transistor structure may have the second conductivity type (e.g. p+ doped). Optionally, a highly doped field stop region having the first conductivity type (e.g. n+ doped) may be located between the drift region and the second emitter/collector region of the IGBT transistor structure.

The first lateral surface or front surface of the semiconductor substrate may be a surface of the semiconductor substrate towards metal layers, insulation layers and/or passivation layers on top of the surface of the substrate or a surface of one of these layers. For example, a semiconductor substrate front side may be the side at which active elements of the chip are formed. For example, in a power semiconductor chip, a chip front side may be a side of the chip at which a source region and a gate region are formed, and a chip back side may be a side of the chip at which a drain region is formed. For example, more complex structures may be located at the chip front side than at the chip back side.

A lateral surface of the semiconductor substrate may be a substantially even plane (e.g. neglecting unevenness of the semiconductor structure due to the manufacturing process and trenches). For example, the lateral dimension of the lateral surface of the semiconductor substrate may be more than 100 times larger (or more than 1000 times or more than 10000 times) than a maximal height of structures on the main surface. In comparison to a basically vertical edge (e.g. resulting from separating the substrate of the chip from others) of the semiconductor substrate, the lateral surface may be a basically horizontal surface extending laterally. The lateral dimension of the lateral surface of the semiconductor substrate 102 may be more than 100 times larger (or more than 1000 times or more than 10000 times) than a basically vertical edge of the semiconductor substrate, for example.

The first lateral direction may be a direction substantially parallel to a lateral surface of the semiconductor substrate, for example. The second lateral direction may be a direction substantially parallel to the lateral surface of the semiconductor substrate, and orthogonal (or perpendicular) to the first lateral direction, for example. A vertical direction may be a direction orthogonal (or perpendicular) to the lateral surface of the semiconductor substrate, for example.

A region comprising the first conductivity type may be a p-doped region (e.g. caused by incorporating aluminum ions, gallium ions, or boron ions) or an n-doped region (e.g. caused by incorporating phosphorus ions, antimony ions or arsenic ions). Consequently, the second conductivity type indicates an opposite n-doped region or p-doped region. In other words, the first conductivity type may indicate a p-doping and the second conductivity type may indicate an n-doping or vice-versa.

Figure 2:
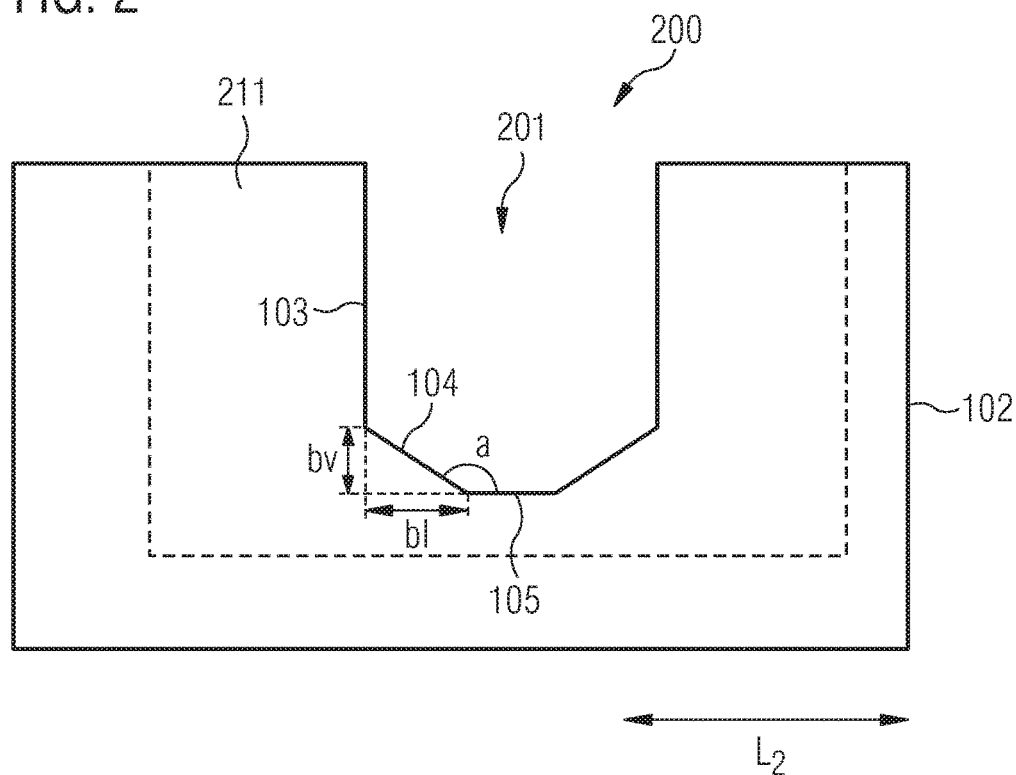
FIG. 2 shows a schematic illustration of a further semiconductor device.

FIG. 2 shows a schematic illustration of a semiconductor device 2

The semiconductor device 200 comprises a trench 201 formed in an active region 211 of a semiconductor substrate 102. The trench 201 comprises at least one sidewall 103 comprising a bevel portion 104 located adjacent to a bottom 105 of the trench 201. An angle, a, between the bevel portion 104 and the bottom 105 of the trench 201 lies between 110° and 160°. A lateral dimension, b1, of the bevel portion 104 is larger than 50 nm.

Due to the angle between the bevel portion 104 and the bottom 105 of the trench 201 lying between 110° and 160°, and the lateral dimension of the bevel portion 105 being larger than 50 nm, an electric field strength at the trench may be reduced. For example, peaks of the electric field and/or weaknesses of an insulation layer (e.g. a gate insulation layer or gate oxide) at edges of the trench may be reduced. Thus, the semiconductor device 200 may be more robust against high electric fields, for example.

The active region 211 of the semiconductor substrate 102 may be a region or portion of the semiconductor substrate 102 through which more than 80% (or e.g. more than 90%, or e.g. more than 95%) of the electric current of the semiconductor device flows, for example. For example, the active region 211 may be a region or a portion of the semiconductor substrate 102 in which at least one electrical structure, at least one (or e.g. a plurality of) transistor structure and/or at least one (or e.g. a plurality of) diode structure is formed, for example. In a top view of the semiconductor device, the active region 211 may be laterally surrounded (or laterally encircled) by an edge termination region (or e.g. an edge region) of the semiconductor substrate 102 in which one or more field plates are formed, for example.

The trench 201 (or one or more trenches 201, or several trenches 201) may be formed wholly (or fully) within the active region 211 of the semiconductor substrate, for example. For example, the trench 201 may be located in the active region 211 of the semiconductor substrate 102 at least 500 nm (or e.g. at least 1 µm, or e.g. at least 2 µm) away (or apart) from an edge termination region of the semiconductor substrate 102, for example.

The bevel portion 104 may have a substantially planar (or e.g. straight) or flat surface neglecting a surface roughness caused by processes for forming the gate trench 101, for example. For example, a maximum deviation of the surface of the bevel portion 104 (over more than 95%, or e.g. over more than 99%, or e.g. over the whole bevel portion 104) from an approximated line of fitting of the bevel portion 104 may be less than 5 nm (or e.g. less than 3 nm, or e.g. less than 1 nm), for example.

The approximate line of fitting of the bevel portion 104 may be a line of best fit or a line of fitting based on the surface roughness of the surface of the bevel portion 104. For example, the approximate line of fitting of the bevel portion 104 may be a line of best fit or a line of fitting determined by the method of at least squares based on variations or deviations of (or along) the surface of the bevel portion 104, for example.

The angle, a between the bevel portion 104 and the bottom 105 of the gate trench 101 lies between 110° and 160° (or e.g. between 120° and 150°, or e.g. between 130° and 140°), for example. The angle, a, between the bevel portion 104 and the bottom 105 of the gate trench 101 may be an angle between an approximated line of fitting of the bevel portion 104 and the bottom 105 of the gate trench 101 (or e.g. an approximated line of fitting of the bottom 105 of the gate trench 101), for example.

The lateral width, b1, of the bevel portion 104 is larger than 50 nm (or e.g. larger than 100 nm, or e.g. larger than 200 nm) over more than 95%, or e.g. more than 99% of the lateral length of the gate trench, for example. For example, the lateral width, b1, of the bevel portion 104 may lie between 50 nm and 1 µm, (or e.g. between 50 nm and 600 nm, or e.g. between 50 nm and 300 nm, or e.g. between 100 nm and 200 nm), for example.

The minimum (or smallest) vertical dimension (or height), bv, of the bevel portion of the at least one sidewall may be less than 50% (or e.g. or e.g. less than 40%, or e.g. less than 30%) of the maximum depth of the gate trench 101. A maximum depth of the gate trench may be less than 10 μm (or e.g. less than 8 μm, or e.g. less than 5 μm), for example.

The trench 201 may be a trench of at least one electrical structure formed in the active region 211 of the semiconductor substrate. For example, the trench 201 may be a gate trench of at least one transistor structure or at least one diode structure formed in the active region 211 of the semiconductor substrate 102, for example.

The trench 201 may include one or more or all of the features described in connection with the gate trench of FIG. 1, for example.

More details and aspects are mentioned in connection with the embodiments described above or below. The embodiments shown in FIG. 2 may comprise one or more optional additional features corresponding to one or more aspects mentioned in connection with the proposed concept or one or more embodiments described above (e.g. FIG. 1) or below (e.g. FIGS. 3 to 5D).

Figure 3:
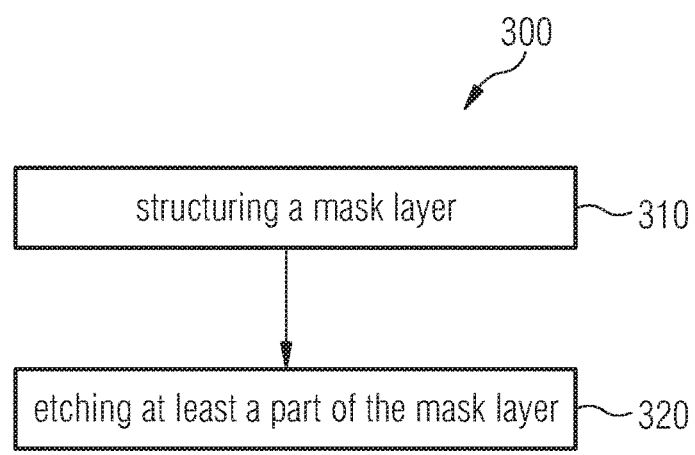
FIG. 3 shows a schematic illustration of a flow chart of a method for forming a semiconductor device.

FIG. 3 shows a schematic illustration of a flow chart of a method 300 for forming a semiconductor device.

The method 300 comprises structuring 310 a mask layer formed at a semiconductor substrate to form an opening in the mask layer. The opening comprises a mask bevel edge. The method 300 further comprises etching 320 at least a part of the mask layer and the semiconductor substrate during the same etching process to form a trench extending into the semiconductor substrate. The trench comprises a width of less than 10 μm. A sidewall of the trench formed by the etching process comprises a bevel portion based on a reproduction of the mask bevel edge of the mask layer in the semiconductor substrate.

Due to a sidewall of the trench formed by the etching process comprising a bevel portion based on a reproduction of the mask bevel edge of the mask layer in the semiconductor substrate, an electric field strength at the trench of the semiconductor device to be formed may be reduced, for example. For example, peaks of the electric field and/or weaknesses of an insulation layer (e.g. a gate insulation layer or gate oxide) at edges of the trench may be reduced. Thus, the semiconductor device to be formed may be more robust against high electric fields, for example.

The method 300 may include forming (e.g. depositing) the mask layer on a first lateral surface of the semiconductor substrate. The mask layer may be a hard mask layer, for example. For example, the mask layer may include (or may be) silicon dioxide layer, a silicon nitride layer, a borophosphosilicate glass layer, a phosphosilicate glass layer or a borosilicate glass layer, or a stack including or formed by two or more of these layers. The hard mask layer for the trench etching may be made (or formed) by depositing a furnace oxide or a plasma oxide, and by a subsequent patterning using photolithographic technology. The patterning by lithography of a photoresist layer formed on the mask layer may uncover portions of the mask layer at which the opening in the mask layer is to be formed, for example.

Structuring 310 the mask layer may include forming a (or one) trench (which may be one of a plurality of identical trenches) in the mask layer after forming (or depositing) the mask layer on the first lateral surface of the semiconductor substrate to form a (or one) trench in the semiconductor substrate. The trench (of the plurality of trenches) may be formed in the mask layer at a portion of the mask layer uncovered (e.g. not covered) by the photoresist layer, for example. The trench of the mask layer may form an opening in the mask layer. Structuring 310 the mask layer may include using wet chemical etching to form the trench (of the plurality of trenches) in the mask layer, for example. The (or each) trench of the mask layer may include vertical sidewalls (e.g. a first vertical sidewall and an opposite second vertical sidewall). A bottom of the trench (or opening of the mask layer) may connect the vertical sidewalls of the trench, for example. For example, an angle between a vertical sidewall of the trench of the mask layer and the first lateral surface of the semiconductor substrate may lie between 80° and 100° (or e.g. between 85° and 95°, or e.g. between 89° and 91°, or e.g. may be 90°), for example.

The (or each) trench formed in the mask layer may extend from a first (or front) lateral surface of the mask layer to the first lateral surface of the semiconductor substrate, for example. Forming a trench in the mask layer may thus uncover a portion of the first lateral surface of the semiconductor substrate at which a trench (of a plurality of trenches) is to be formed in the semiconductor substrate. For example, the bottom of the trench (or opening) of the mask layer may be located adjacent to the portion of the of the first lateral surface of the semiconductor substrate at which the trench is to be formed in the semiconductor substrate.

The lateral width of the trench of the mask layer at the first lateral surface of the mask layer may be smaller than or equal to a lateral width of the trench to be formed in the semiconductor substrate. The lateral width of the trench to be formed in the semiconductor substrate may be the width measured at the first lateral surface of the semiconductor substrate, for example. The lateral width of the trench to be formed in the semiconductor substrate may be less than 10 μm (or e.g. less than 8 μm, or e.g. less than 5 μm, or e.g. less than 4 μm, or e.g. less than 3 μm) at the first lateral surface of the semiconductor substrate 102, for example.

Structuring 310 the mask layer may further include modifying an edge portion of the trench of the mask layer to form the mask bevel edge of the opening after forming the trench in the mask layer, for example. The edge portion of the mask layer may be an edge portion of the trench of the mask layer, for example. For example, the edge portion of the mask layer may be located laterally adjacent to a sidewall of the trench of the mask layer and adjacent to the first (or front) lateral surface of the mask layer, for example. For example, a lateral dimension of the edge portion of the mask layer to be modified may be larger than 50 nm (or e.g. larger than 100 nm, or e.g. larger than 200 nm, or e.g. larger than 500 nm), for example. The lateral dimension of the edge portion of the mask layer may be a dimension (or width) of the edge portion measured laterally from the sidewall of the trench of the mask layer (in the second lateral direction). The edge portion of the mask layer to be modified may extend vertically from the first (front) lateral surface of the mask layer to the first lateral surface of the semiconductor substrate. For example, a vertical dimension of the edge portion of the mask layer to be modified may be (substantially) equal to a thickness of the mask layer, for example.

Structuring 310 the mask layer may include structuring the photoresist layer located on the mask layer (e.g. in a photolithographic process, or e.g. in a greyscale lithography process) to uncover (or e.g. to expose) the edge portion of the mask layer to be modified before modifying the edge portion of the mask layer.

Structuring 310 the mask layer (e.g. modifying the edge portion of the trench of the mask layer) may include incorporating (or e.g. implanting) ions (e.g. argon Ar ions) into the edge portion of the mask layer (e.g. into the edge portion of the trench of the mask layer) to modify the edge portion of the trench of the mask layer (in a damage implantation process). Structuring 310 the mask layer may include implanting the ions to cause damages to and/or to introduce detects into the edge portion of the trench of the mask layer.

Structuring 310 the mask layer may further include etching the edge portion of the mask layer (e.g. the edge portion of the trench of the mask layer) after incorporating the ions into the edge portion of the mask layer to form the mask bevel edge of the opening. The etching of the edge portion of the mask layer may be carried out by a wet chemical etching process, for example. The incorporating of the ions into the edge portion of the mask layer and the subsequent wet etching of the edge portion of the mask layer may modify the vertical sidewall of the trench of the mask layer to a bevel (or sloping) sidewall of the trench (or opening) of the mask layer. For example, an angle between the mask bevel edge of the opening of the mask layer and a bottom of the opening of the mask layer after structuring 310 the mask layer may lie between 110° and 160° (or e.g. between 120° and 150°, or e.g. between 130° and 140°), for example.

Optionally or alternatively, structuring 310 the mask layer (e.g. modifying the edge portion of the trench of the mask layer) may include annealing the mask layer above a reflow temperature (or e.g. above a glass transition temperature) of the mask layer so that an edge portion of the mask layer (e.g. an edge portion of the trench of the mask layer) is modified to form the mask bevel edge of the opening. For example, the annealing of the mask layer above the reflow temperature of the mask layer may be carried out to modify the edge portion of the trench of the mask layer instead of or in addition to the damage implantation process. Additionally, the annealing of the mask layer above the reflow temperature of the mask layer may be carried out instead of etching the edge portion of the mask layer. The material of the mask layer may include (or may be) borophosphosilicate glass, phosphosilicate glass or borosilicate glass, for example.

Optionally or additionally, structuring 310 the mask layer (e.g. structuring the portion of the photoresist layer covering the edge portion of the trench of the mask layer) may include forming (e.g. etching) several trenches in the portion of the photoresist layer covering the edge portion of the trench of the mask layer (e.g. instead of incorporating the ions into the mask layer). Etching the plurality of trenches into the portion of the photoresist layer may be carried out so that a trench width of the plurality of trenches of the portion of the photoresist layer and/or a distance between the trenches of the portion of the photoresist layer may be varied (or different from each other). For example, the trench width of the plurality of trenches of the portion of the photoresist layer may decrease (e.g. proportionally) with (proportionally) increasing lateral distance from a sidewall of the edge portion of the trench to be formed in the mask layer and/or the distance between the trenches of the portion of the photoresist layer may increase (e.g. proportionally) with (proportionally) increasing lateral distance from a sidewall of the edge portion of the trench to be formed in the mask layer. After forming the plurality of trenches in the portion of the photoresist layer covering the edge portion of the trench of the mask layer, structuring 310 the mask layer may include modifying the edge portion of the trench of the mask layer by etching several (or a plurality of trenches) into the edge portion of the mask layer based on the plurality of trenches of the photoresist layer. For example, structuring 310 the mask layer may include etching the plurality of trenches into the edge portion of the mask layer at portions of the mask layer uncovered (e.g. exposed) by the plurality of trenches of the portion of the photoresist layer. Thus, a trench width of the plurality of trenches of the edge portion of the mask layer and/or a distance between the trenches of the edge portion of the mask layer may be varied (or different from each other). For example, the trench width of the plurality of trenches of the edge portion of the mask layer may decrease (e.g. proportionally) with (proportionally) increasing lateral distance from a sidewall of the edge portion of the trench to be formed in the mask layer and/or the distance between the trenches of the edge portion of the mask layer may increase (e.g. proportionally) with (proportionally) increasing lateral distance from a sidewall of the edge portion of the trench to be formed in the mask layer. Additionally, structuring 310 the mask layer may include annealing the mask layer above the reflow temperature after forming the plurality of trenches in the edge portion of the mask layer to form the mask bevel edge (and e.g. after removing the photoresist layer). Due to the increasing amount of material of the mask layer at an increasing lateral distance from the sidewall of the edge portion of the trench formed in the mask layer (based on the varying trench width of the plurality of trenches in the edge portion of the mask layer and/or the varying distance between the trenches in the edge portion of the mask layer), the mask bevel edge of the opening may be formed at the edge portion of the trench formed in the mask layer after annealing the mask layer, for example.

The method 300 may further include etching 320 at least a part of the mask layer and the semiconductor substrate during the same etching process to form a trench extending into the semiconductor substrate after structuring 310 the mask layer. The etching of at least the part of the mask layer and the semiconductor substrate may be carried out by a plasma etching process (and or e.g. a dry chemical etching process, and/or e.g. an anisotropic etching process), for example.

The modified edge portion of the trench of the mask layer comprising the mask bevel edge and the semiconductor substrate may be etched (simultaneously) during the same etching process. The portion of the first lateral surface of the semiconductor substrate uncovered by the opening (e.g. the trench) of the mask layer may be etched first during the etching process because it may be directly exposed to the etchants of the etching process. Additionally, the uncovered (or exposed) portion of the first lateral surface of the semiconductor substrate may become gradually larger during the etching process due to the simultaneous etching of the mask layer (e.g. the mask bevel edge) during the etching process, for example. The etching of the semiconductor substrate during the etching process may depend on the thickness of the mask layer at the mask bevel edge, for example. For example, the simultaneous etching of the mask layer during the etching process may gradually uncover the first lateral surface of the semiconductor substrate below the mask bevel edge during the etching process based on the gradually increasing thickness of the mask layer at the mask bevel edge, for example.

In this way, the mask bevel edge of the mask layer may be reproduced at the semiconductor substrate. For example, the mask bevel edge of the mask layer may be mapped or reproduced at on, or in) the semiconductor substrate. Thus, a sidewall of the trench in the semiconductor substrate formed by the etching process may include the bevel portion based on a reproduction of the mask bevel edge of the mask layer in the semiconductor substrate.

Figure 4A:
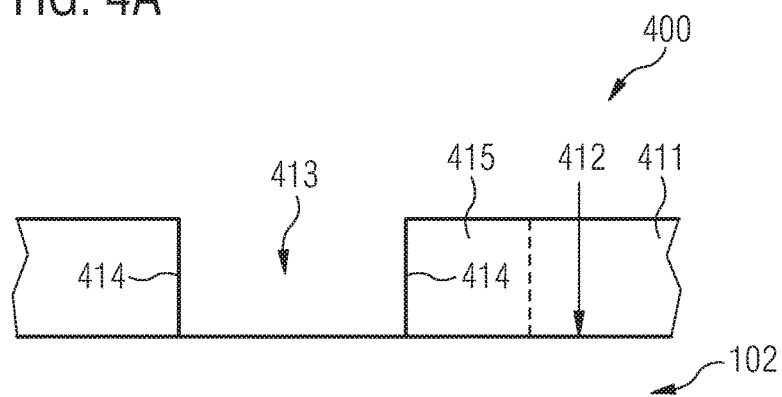
FIGS. 4A to 4C show schematic illustrations of a method for forming a semiconductor device.
Figure 4B:
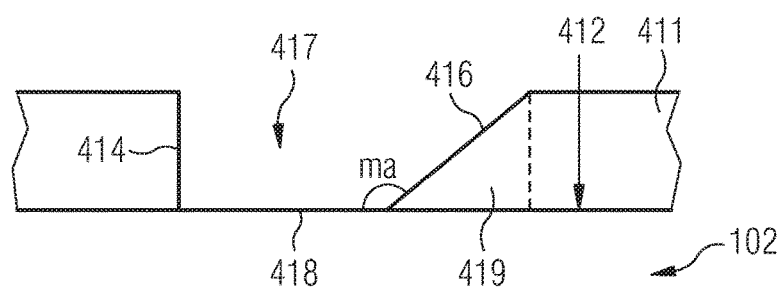
Figure 4C:
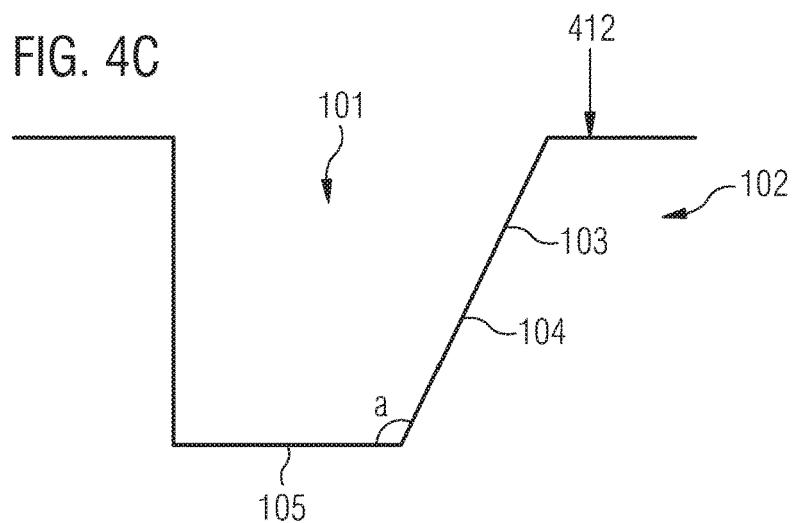

It may be understood that a bevel portion being based on a reproduction of the mask bevel edge of the mask layer in the semiconductor substrate may mean that an angle, a, between the bevel portion of the sidewall of the gate trench and the bottom of the gate trench formed after the etching of the semiconductor substrate (as shown in FIG. 4C) may depend on an angle, ma, between the mask bevel edge of the opening of the mask layer and the portion of the first lateral surface of the semiconductor substrate uncovered by the mask layer before the etching process (as shown in FIG. 4B). The reproduction of the mask bevel edge of the mask layer in the semiconductor substrate does not necessarily imply that the angle, a, is equal to the angle, ma. However, it may be understood that the examples described herein may optionally include the case where angle, a, equals angle, ma, if the etch rates of the mask layer and the semiconductor substrate are equal (e.g. a 1:1 etch ratio), for example.

A bevel portion being based on a reproduction of the mask bevel edge of the mask layer in the semiconductor substrate may mean that the angle, a, between the bevel portion of the sidewall of the gate trench and the bottom of the gate trench formed after the etching process, and the angle, ma, between the mask bevel edge of the opening of the mask layer and the portion of the first lateral surface of the semiconductor substrate uncovered by the mask layer before the etching process may be equal (or may differ by more than +/−1°, or more than +/−5° or more than +/−10° or more than 20° or more than +/−30°.

The angle, a, between the bevel portion of the sidewall of the gate trench and the bottom of the gate trench formed after the etching process, and the angle, ma, between the mask bevel edge of the opening of the mask layer and the portion of the first lateral surface of the semiconductor substrate uncovered by the mask layer (and e.g. the ratio between these two angles), may depend on the ratio of the etch rate of the mask layer and the etch rate of the semiconductor substrate during the simultaneous etching process. For example, depending on the ratio of the etch rate of the material of the mask layer and of the semiconductor substrate of the etching process, the tilt of the bevel portion of the semiconductor substrate and the tilt of the bevel mask edge of the mask layer may be basically the same or may differ from each other.

For example, if the ratio of the etch rates is approximately 1, the tilt angles may be basically the same. For example, the angle, a, between the bevel portion of the sidewall of the gate trench and the bottom of the gate trench may be equal to the angle, ma, between the mask bevel edge of the opening of the mask layer and the portion of the first lateral surface of the semiconductor substrate uncovered by the mask layer before the etching process. For example, the angle, a, between the bevel portion of the sidewall of the gate trench and the bottom of the gate trench may deviate from the angle, ma, between the mask bevel edge of the opening of the mask layer and the portion of the first lateral surface of the semiconductor substrate uncovered by the mask layer before the etching process by less than +/−2%, (or e.g. +/−1%, or e.g. less than +/−0.5%)

Otherwise (e.g. if the ratio of the etch rates not equal to 1), the tilt angles may vary more or less from each other, but may still be proportional to the ratio of the etch rates. For example, the angle, a, between the bevel portion of the sidewall of the gate trench and the bottom of the gate trench may be differ from the angle, ma, between the mask bevel edge of the opening of the mask layer and the portion of the first lateral surface of the semiconductor substrate uncovered by the mask layer before the etching process based on (e.g. proportionally, or e.g. inversely proportionally to) the ratio of the etch rates.

The ratio of the etch rates may depend on the material of the mask layer, the doping concentration of a layer of semiconductor substrate exposed at the surface of the semiconductor substrate (e.g. of a layer of a silicon carbide wafer exposed at the surface of the silicon carbide wafer) and/or the parameters and etching agents used for the mutual dry chemical etching process, for example.

The width of the trench formed in the semiconductor substrate at the first lateral surface of the semiconductor substrate may be less than 10 μm (or e.g. less than 8 μm, or e.g. less than 5 μm, or e.g. less than 4 μm, or e.g. less than 3 μm), for example.

Optionally, the method 300 may include forming the bevel portion at only one sidewall of the trench of the semiconductor substrate. For example, structuring 310 the mask layer may include structuring the photoresist layer located on the mask layer to uncover (or e.g. to expose) one (e.g. a first) edge portion of the mask layer to be modified adjacent to a (e.g. one) first sidewall of the trench of the mask layer. A second edge portion of the mask layer adjacent to an opposite second sidewall of the trench of the mask layer may be covered by the photoresist layer during the modifying of the (first) edge portion of the mask layer. Thus, only one edge portion of the trench of the mask layer may be modified to form one mask bevel edge of the opening of the mask layer.

Optionally or alternatively, the method 300 may include forming the bevel portion at a first sidewall of the trench of the semiconductor substrate and a bevel portion at an opposite second sidewall of the trench of the semiconductor substrate. For example, structuring 310 the mask layer may include modifying the first edge portion of the trench of the mask layer (at the first sidewall of the trench of the mask layer) to form the first mask bevel edge of the opening and modifying the second edge portion of the trench of the mask layer (at an opposite second sidewall of the trench of the mask layer) to form the second mask bevel edge of the opening. The second edge portion of the trench of the mask layer may be modified simultaneously in the same identical process as that used for modifying the first edge portion of the trench of the mask layer. Thus, a first sidewall of the trench in the semiconductor substrate formed by the etching process may include the first bevel portion based on a reproduction of the first mask bevel edge of the mask layer in the semiconductor substrate. Additionally, a second sidewall of the trench in the semiconductor substrate formed by the etching process may include a second bevel portion based on a reproduction of the second mask bevel edge of the mask layer in the semiconductor substrate.

The method 300 describes a method for forming the semiconductor device in which the mask layer may be masked by the photoresist mask which covers one or none of the edges of the oxide mask, for example. Following the depositing and patterning of the oxide mask, of which the opening needs to be (or may be) selected smaller than the width of the subsequent trench, the damage implantation with Ar ions may be incorporated into the oxide mask using the resist mask. The oxide flank is chamfered using a wet-chemical etching. By chamfering the oxide hard mask prior to etching the trenches using the damage implantation (with argon Ar ions) and the subsequent wet-chemical etching (of the mask layer), the flank angle may be transferred into the semiconductor. After this, the trench is etched in the semiconductor substrate by the plasma etching process. Thus, the 90° angle between one or both sidewalls may be converted into an incline and the field strength may therefore be reduced. For example, a reduction in the electric field strength may be achieved by increasing the angle between the floor and the sidewall of the trench, for example.

Optionally, structuring 310 the mask layer to form a trench in the semiconductor substrate may include forming more than one trench (e.g. two or more trenches) in the mask layer. For example, structuring 310 the mask layer may include etching a first portion of the mask layer to form a first trench in the mask layer and etching a second portion of the mask layer at a bottom of the first trench of the mask layer to form a second trench below the first trench. After etching the first portion of the mask layer, the first trench of the mask layer may extend from the first lateral surface of the mask layer towards the semiconductor substrate, but does not uncover the semiconductor substrate.

The first trench may include vertical sidewalls (e.g. a first vertical sidewall and an opposite second vertical sidewall). The first vertical sidewall of the first trench of the mask layer may form a first vertical portion of the opening of the mask layer after structuring 310 the mask layer. The opposite second vertical sidewall of the first trench of the mask layer may form a second vertical portion of the opening of the mask layer after structuring 310 the mask layer.

Etching the second portion of the mask layer to form the second trench may include etching a portion of the mask layer below the first trench of the mask layer. For example, etching the second portion of the mask layer to form the second trench may include etching the second portion of the mask layer from the bottom of the first trench until a portion of the semiconductor substrate is uncovered (or exposed). Thus, the bottom of the second trench may be located at (or e.g. directly adjacent to) a portion of the first lateral surface of the semiconductor substrate.

A minimum width of the first trench of the mask layer at the bottom of the first trench of the mask layer before etching the second trench of the mask layer may be larger (e.g. more than 1.5 times larger, or e.g. more than 2 times larger) than a minimum width of the second trench of the mask layer at the top of the second trench of the mask layer, for example.

An minimum (or smallest) depth of the first trench of the mask layer before forming the second trench of the mask layer may be larger (e.g. more than 1.5 times larger, or e.g. more than 2 times larger) than a maximum (or largest) depth of the second trench of the mask layer, for example.

Structuring 310 of the mask layer may include modifying a first edge portion of the mask layer at a first sidewall of the second trench of the mask layer to form a first mask bevel edge of the opening and modifying a second edge portion of the mask layer at an opposite second sidewall of the second trench of the mask layer to form a second mask bevel edge of the opening.

The first edge portion of the mask layer to be modified may be located laterally adjacent to a first sidewall of the second trench of the mask layer and adjacent to a portion of the bottom of the first trench at the first sidewall of the second trench of the mask layer, for example. For example, the first edge portion of the mask layer may extend laterally from the first sidewall of the second trench of the mask layer towards (or to) a first sidewall of the first trench of the mask layer, for example.

The second edge portion of the mask layer to be modified may be located laterally adjacent to a second sidewall of the second trench of the mask layer and adjacent to a portion of the bottom of the first trench at the second sidewall of the second trench of the mask layer, for example. For example, the second edge portion of the mask layer may extend laterally from the second sidewall of the second trench of the mask layer towards (or to) a second sidewall of the first trench of the mask layer, for example.

Structuring 310 the mask layer may include structuring the photoresist layer located on the mask layer to uncover (or e.g. to expose) the first edge portion of the mask layer and the second edge portion of the mask layer to be modified before modifying the first edge portion and the second edge portion of the mask layer, for example.

Structuring 310 the mask layer may further include modifying the first edge portion of the trench of the mask layer to form the first mask bevel edge and modifying the second edge portion of the trench of the mask layer to form the second mask bevel edge, for example.

The first mask bevel edge of the mask layer may extend from the first sidewall of the first trench of the mask layer to a bottom of the second trench of the mask layer at the semiconductor substrate, for example. The first mask bevel edge of the opening of the mask layer may be connected to (or e.g. may abut, or e.g. may be adjacent to) the first vertical portion of the opening of the mask layer after structuring 310 the mask layer, for example.

The second mask bevel edge of the mask layer may extend from the second sidewall of the first trench of the mask layer to a bottom of the second trench of the mask layer at the semiconductor substrate, for example. The second mask bevel edge of the opening of the mask layer may be connected to (or e.g. may abut, or e.g. may be adjacent to) the second vertical portion of the opening of the mask layer after structuring 310 the mask layer, for example.

A portion of the first lateral surface of the semiconductor substrate which is uncovered by the mask layer may be located laterally between the first mask bevel edge of the mask layer and the second mask bevel edge of the mask layer after structuring 310 the mask layer, for example.

The method 300 may further include etching 320 at least a part of the mask layer and the semiconductor substrate simultaneously during the same etching process to form the trench extending into the semiconductor substrate after structuring 310 the mask layer. Thus, a first sidewall of the trench in the semiconductor substrate formed by the etching process may include the first bevel portion based on a reproduction of the first mask bevel edge of the mask layer in the semiconductor substrate. Additionally, a second sidewall of the trench in the semiconductor substrate formed by the etching process may include a second bevel portion based on a reproduction of the second mask bevel edge of the mask layer in the semiconductor substrate.

The (simultaneous) etching process for etching the semiconductor substrate and at least the part of the mask layer may continue after the mask bevel edge of the opening is removed (e.g. etched away) from the semiconductor substrate. Thus, a first sidewall of the trench formed in the semiconductor substrate may include a first vertical portion, and an opposite second sidewall, of the trench formed in the semiconductor substrate may include a second vertical portion, for example.

Optionally, the first bevel portion of the first sidewall of the gate trench and the second bevel portion of the second sidewall of the gate trench may be the same or different from each other. For example, optionally, the bevel (or tilt) angle between the first bevel portion of the first sidewall of the gate trench and the bottom of the gate trench may be the same or different from the bevel (or tilt) angle between the second bevel portion of the second sidewall of the gate trench and the bottom of the gate trench. Additionally or optionally, a lateral dimension and/or vertical dimension of the first bevel portion of the first sidewall of the gate trench and a lateral dimension and/or vertical dimension of the second bevel portion of the second sidewall of the gate trench may be the same or different from each other.

In order that the bevel (or tilt) angle of the first bevel portion of the first sidewall of the gate trench and the bevel (or tilt) angle between the second bevel portion of the second sidewall of the gate trench are different, structuring 310 of the mask layer may include modifying the mask layer so that the first mask bevel edge may have a different bevel (or tilt) angle from the second mask bevel edge. For example, a bevel (or tilt) angle between the first mask bevel edge of an opening of the mask layer and the portion of the first lateral surface of the semiconductor substrate uncovered by the mask layer may be different from a bevel (or tilt) angle between the second mask bevel edge of an opening of the mask layer and the portion of the first lateral surface of the semiconductor substrate uncovered by the mask layer before the etching process. Additionally or optionally, a lateral dimension of the first mask bevel edge and a lateral dimension of the second mask bevel edge may be different.

Structuring 310 the mask layer may include controlling or varying at least one of a depth of the first trench of the mask layer, a width of the first trench of the mask layer and relative position of the first trench of the mask layer with respect to the second trench of the mask layer, and at least one of a depth of the second trench of the mask layer, a width of the second trench of the mask layer and a relative position of the second trench of the mask layer with respect to the first trench of the mask layer, to obtain the different bevel (or tilt) angles and/or the different lateral dimensions of the first mask bevel edge and the second mask bevel edge. For example, the different bevel (or tilt) angles and/or the different lateral dimensions of the first mask bevel edge and the second mask bevel edge may be obtained by structuring 310 the mask layer so that a lateral dimension of the first edge portion of the mask layer and a lateral dimension of the second edge portion of the mask layer may be different from each other. For example, the different lateral dimensions of the first edge portion of the mask layer and the second edge portion of the mask layer may be obtained based on a position of the second trench with respect to the first trench formed during the structuring 310 of the mask layer, for example.

The method 300 may further include forming a gate insulation layer and a gate electrode of at least one transistor in the trench. The gate insulation layer may be formed (or deposited) on the sidewalls (e.g. on the bevel portion and/or on the vertical portion) of the trench of the semiconductor substrate and/or at the bottom of the trench of the semiconductor substrate, for example. The gate electrode material may be formed by depositing gate electrode material in (or within) each gate trench after forming the gate insulation layer, for example. The gate insulation layer may be located between the gate electrode material of the gate electrode and a sidewall of the trench of the semiconductor substrate, for example.

The method 300 may further include forming a body region of at least one transistor in the semiconductor substrate (e.g. by implanting or incorporating doping ions into the semiconductor substrate). The bevel portion of a sidewall of the trench may be located deeper in the semiconductor substrate than a maximum (or deepest) depth of the body region at the sidewall of the trench. For example, a portion of the body region adjacent to the sidewall of the trench may be adjacent to the vertical portion of the sidewall of the trench but does not vertically overlap the bevel portion of the sidewall of the trench. For example, a maximum depth of the body region at the sidewall of the trench may be smaller (or shallower) than a depth of the bevel portion of the sidewall of the trench, for example. Additionally, the bevel portion of the sidewall of the trench may be laterally adjacent to a drift region of the at least one transistor.

The method 300 as described in connection with FIG. 3 describes the manufacture of a trench in the semiconductor substrate including at least one sidewall with a bevel portion. It may be understood that the method 300 may be used to form simultaneously a plurality of trenches in the semiconductor substrate, wherein each trench includes at least one sidewall with the bevel portion.

More details and aspects are mentioned in connection with the embodiments described above or below. The embodiments shown in FIG. 3 may comprise one or more optional additional features corresponding to one or more aspects mentioned in connection with the proposed concept or one or more embodiments described above (e.g. FIGS. 1 to 2) or below (e.g. FIGS. 4A to 5D).

FIGS. 4A to 4C show schematic cross-sectional illustrations of a method 400 for forming a semiconductor device. For example, FIGS. 4A to 4C show a chamfering of a trench wall by chamfering a hard mask.

As shown in FIG. 4A, the method 400 may include forming a mask layer 411 (e.g. a hard mask layer) at (or e.g. on) a first lateral surface 412 of a semiconductor substrate 102.

The method 400 may further include structuring the mask layer 411 formed at the semiconductor substrate 102 to form an opening in the mask layer 411.

A material of the mask layer 411 may include (or may be) silicon dioxide, silicon nitride, borophosphosilicate glass, phosphosilicate glass or horosilicate glass. For example, the mask layer may include (or may be) silicon dioxide layer, a silicon nitride layer, a borophosphosilicate glass layer, a phosphosilicate glass layer or a horosilicate glass layer, or a combination of two or more of these layers.

Structuring the mask layer 411 may include forming (e.g. depositing) a photoresist layer on the mask layer. Forming the photoresist layer may further include (e.g. patterning and structuring) the photoresist layer by photolithography (e.g. by greyscale lithography) to uncover a portion of the mask layer 411 at which a trench of the mask layer 411 is to be formed. For example, structuring the mask layer 411 may include structuring the photoresist layer formed on the mask layer by greyscale lithography to uncover at least part of the mask layer to be modified.

Structuring the mask layer 411 may include forming the trench 413 at a portion of the mask layer 411 uncovered by the photoresist layer. The trench 413 of the mask layer 411 may include vertical sidewalls 414 (e.g. a first vertical sidewall and an opposite second vertical sidewall). Forming the trench 413 in the mask layer 411 may thus uncover a portion of the first lateral surface 412 of the semiconductor substrate 102 at the bottom of the trench 413. For example, a bottom of the trench 413 of the mask layer 411 may be (directly) adjacent to or directly on a portion of the first lateral surface 412 of the semiconductor substrate 102 at which a trench is to be formed in the semiconductor substrate 102.

As shown in FIGS. 4A and 4B, structuring the mask layer 411 may further include modifying an edge portion 415 (shown in FIG. 4A) of the trench 413 of the mask layer 411 to form the mask bevel edge 416 of the opening 417 after forming the trench 413 in the mask layer 411, for example.

Structuring the mask layer 411 may further include structuring the photoresist layer formed on the mask layer 41110 uncover (or e.g. to expose) at least parts of the edge portion 415 of the mask layer 411 to be modified before modifying the edge portion 415 of the mask layer 411.

Structuring the mask layer 411 may further include incorporating (or e.g. implanting) ions (e.g. argon Ar ions) into the edge portion 415 of the mask layer 411 (e.g. into the edge portion of the trench of the mask layer) to modify the edge portion 415 of the mask layer. The ions may be incorporated (or implanted) into the edge portion of the mask layer from (or e.g. through, or e.g. via) the first (or front) lateral surface of the edge portion of the mask layer and/or at a sidewall 414 adjacent to the edge portion 415 of the trench 413 of the mask layer 411.

Structuring the mask layer 411 may further include etching (e.g. by wet chemical etching) the edge portion 415 of the mask layer 411 after incorporating (e.g. implanting) the ions into the edge portion 415 of the mask layer 411, or alternatively after etching the plurality of trenches into the photoresist layer. The incorporating of the ions into the edge portion of the mask layer and the subsequent wet etching of the edge portion of the mask layer may modify the (whole or entire) vertical sidewall 414 of the trench 413 of the mask layer 411 to the bevel (or sloping) sidewall 416 of the opening 417 of the mask layer.

An angle, ma, between the mask bevel edge 416 of the opening 417 of the mask layer 411 and a portion 418 of the first lateral surface 412 of the semiconductor substrate uncovered by the mask layer and adjacent to the mask bevel edge 416 may lie between 110° and 160° (or e.g. between 120° and 150°, or e.g. between 130° and 140°), for example.

Optionally or alternatively, if the mask layer is a borophosphosilicate glass layer, a phosphosilicate glass layer or a borosilicate glass layer, structuring the mask layer 411 may include annealing the mask layer 411 above a reflow temperature (or e.g. above a glass transition temperature) of the mask layer so that the edge portion 415 of the mask layer 411 is modified to form the mask bevel edge 416 of the opening 417 of the mask layer 411.

As shown in FIG. 4C, the method 400 may further include etching at least part of the mask layer 411 and the semiconductor substrate 102 simultaneously during the same etching process to form a trench 101 extending into the semiconductor substrate 102. The etching of at least the part of the mask layer 411 and the semiconductor substrate 102 may be carried out by a plasma etching process (e.g. a dry chemical etching process), for example.

The modified edge portion 419 of the trench of the mask layer comprising the mask bevel edge 416 and the semiconductor substrate 102 may be etched (simultaneously) during the same etching process. The mask bevel edge 416 of the mask layer 411 may be mapped or reproduced at (or on, or in) the semiconductor substrate 102.

The trench 101 formed in the semiconductor substrate 102 after the etching of at least the part of the mask layer 411 and the semiconductor substrate 102 may include a sidewall 103 including the bevel portion 104 located adjacent to the bottom 105 of the trench 101. The bevel portion 104 of the sidewall 103 may extend from the bottom of the gate trench 101 to a first lateral surface of the semiconductor substrate 102, for example. For example, the bevel portion 104 of the sidewall 103 of the trench of the semiconductor substrate 102 may be (or may include) the entire (or whole) sidewall 103 of the trench of the semiconductor substrate 102, for example.

An angle, a, between the bevel portion 104 and the bottom 105 of the gate trench 101 may lie between 110° and 160° (or e.g. between 120° and 150°, or e.g. between 130° and 140°), for example.

The trench 101 having the inclined (or bevel) sidewall 103 may be formed in the semiconductor substrate 102 by depositing and patterning the mask layer 411, subsequent damage implantation and wet-chemical etching of the hard mask. Subsequently, the trench 101 may be etched in a plasma etching step or process. The flank angle (of the mask layer 411) may be transferred into the semiconductor substrate 102 depending on the oxide-semiconductor selectivity (e.g. depending on the ratio of the etch rate of the etching process for the material of the mask layer and for the semiconductor substrate). Optionally, a tempering step may be carried out after the removal of layers from the oxide mask in order to favor the rearrangement of the areas exposed after the plasma etching on crystallographically specified areas. For example, the tempering step may include annealing (e.g. heating) the semiconductor substrate after the etching of at least a part of the mask layer 411 and the semiconductor substrate 102 and after removing the mask layer 411 (e.g. any remaining portions of the mask layer 411) formed at the semiconductor substrate 102.

If the resist mask of the damage implantation completely covers an oxide flank (or edge) of the mask layer 411, the edge portions of the mask layer 411 are not chamfered but retracted as a result of the wet-chemical etching, for example.

If the oxide mask layer 411 is a PSG, BPSG or BSG layer, edge rounding of the trenches may optionally be realized by flowing. In case such a flowing technique is employed, the oxide mask layer 411 may, additionally or alternatively, be provided with a trench structure and the flowing step may subsequently be carried out, so that the desired form of the oxide layer results depending on the selected width and distance of the trenches. For example, the design which is specified by the design of the oxide mask allows for a considerable degree of freedom with regard to the width of the chamfer. For example, particularly the gradient in the area of the trench floor may be flexibly set. For this purpose, so-called grey-scale techniques may also be applied, for example.

More details and aspects are mentioned in connection with the embodiments described above or below. The embodiments shown in FIGS. 4A to 4C may each comprise one or more optional additional features corresponding to one or more aspects mentioned in connection with the proposed concept or one or more embodiments described above (e.g. FIGS. 1 to 3) or below (e.g. FIGS. 5A to 5D).

FIGS. 5A to 5D show schematic cross-sectional illustrations of a method 500 for forming a semiconductor device. For example, FIGS. 5A to 5D show a chamfering of a part of the trench floor by plasma etching using an oxide mask.

Figure 5A:
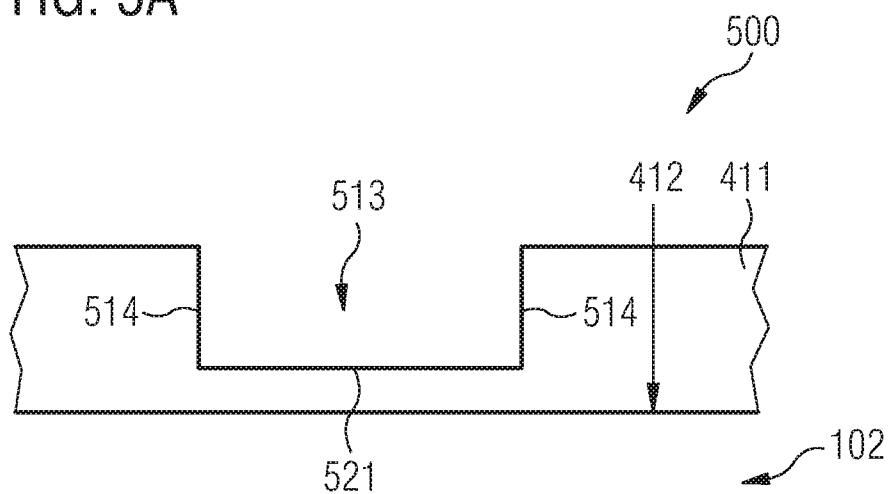

As shown in FIG. 5A, the method 500 may include forming a mask layer 411 (e.g. a hard mask layer) at (or e.g. on) a first lateral surface 412 of a semiconductor substrate 102.

The method 500 may further include structuring the mask layer 411 formed at the semiconductor substrate 102 to form an opening in the mask layer 411.

Structuring the mask layer 411 may include forming (e.g. depositing) a photoresist layer on the mask layer the photoresist layer. Forming the photoresist layer may further include patterning and structuring the photoresist layer by photolithography to uncover a first portion of the mask layer 411 at which a first trench of the mask layer 411 is to be formed.

Structuring the mask layer 411 may include etching a first portion of the mask layer 411 to form a first trench 513 in the mask layer 411. After etching the first portion of the mask layer 411, the first trench 513 of the mask layer 411 may extend from the first lateral surface 412 of the mask layer 411 towards the semiconductor substrate 102, but does not uncover the semiconductor substrate 102.

The first trench 513 may include vertical sidewalls 514 (e.g. a first vertical sidewall and an opposite second vertical sidewall). The first vertical sidewall 514 of the first trench 513 of the mask layer 411 may form a first vertical portion of the opening of the mask layer 411. The opposite second vertical sidewall 514 of the first trench 513 of the mask layer 411 may form a second vertical portion of the opening of the mask layer 411.

Figure 5B:
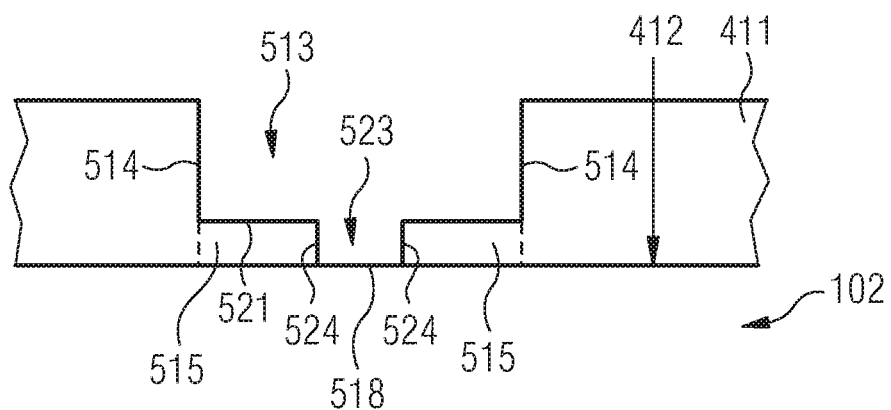

As shown in FIGS. 5A and 5B, structuring the mask layer 411 may further include etching a second portion of the mask layer 411 at a bottom 521 of the first trench 513 of the mask layer to form a second trench 523 below the first trench 513.

A minimum width of the first trench of the mask layer at the bottom of the first trench of the mask layer before etching the second trench of the mask layer may be larger (e.g. more than 1.5 times larger, or e.g. more than 2 times larger) than a minimum width of the second trench of the mask layer at the top of the second trench of the mask layer, for example.

An minimum (or smallest) depth of the first trench of the mask layer before forming the second trench of the mask layer may be may be larger (e.g. more than 1.5 times larger, or e.g. more than 2 times larger) than a minimum (or smallest) depth of the second trench of the mask layer, for example.

Etching the second portion of the mask layer to form the second trench 523 may include etching the portion the second portion of the mask layer from the bottom 521 of the first trench 513 until a portion 518 of first lateral surface 412 of the semiconductor substrate 102 is uncovered (or exposed) at the bottom of the second trench 523. Thus, the bottom of the second trench 523 may be located at (or e.g. directly adjacent to) the portion 518 of the first lateral surface 412 of the semiconductor substrate 102. The second trench 523 may include vertical sidewalls 524 (e.g. a first vertical sidewall and an opposite second vertical sidewall).

As shown in FIGS. 5B and 5C, structuring the mask layer 411 may include modifying a first edge portion 515 of the mask layer 411 at a first sidewall 524 of the second trench 523 of the mask layer 411 to form a first mask bevel edge 516 of the opening 517. Structuring the mask layer 411 may further include modifying a second edge portion 515 of the mask layer 411 at the opposite second sidewall 524 of the second trench 523 of the mask layer 411 to form a second mask bevel edge 516 of the opening 517.

Structuring 310 the mask layer may include structuring the photoresist layer located on the mask layer 411 to uncover (or e.g. to expose) the first edge portion 515 of the mask layer 411 to be modified and the second edge portion 515 of the mask layer 411 to be modified, for example.

The first edge portion 515 to be modified may be located laterally adjacent to the first sidewall 524 of the second trench 523 of the mask layer 411 and adjacent to a portion of the bottom 521 of the first trench 513 at (or adjacent to) the first sidewall 524 of the second trench 523 of the mask layer 411, for example. For example, the first edge portion 515 of the mask layer 411 may extend laterally from the first sidewall 524 of the second trench 523 of the mask layer 411 towards (or to) the first sidewall 514 of the first trench 513 of the mask layer 411, for example.

The second edge portion 515 to be modified may be located laterally adjacent to a second sidewall 524 of the second trench 523 of the mask layer 411 and adjacent to a portion of the bottom 521 of the first trench 513 at the second sidewall 524 of the second trench 523 of the mask layer 411, for example. For example, the second edge portion 515 of the mask layer 411 may extend laterally from the second sidewall 524 of the second trench 523 of the mask layer 411 towards (or to) a second sidewall 514 of the first trench 513 of the mask layer 411, for example.

Structuring the mask layer 411 may further include modifying the first edge portion 515 of the second trench 523 of the mask layer 411 to form the first mask bevel edge 516 of the first sidewall of the opening 517 and modifying the second edge portion 515 of the second trench 523 of the mask layer 411 to form the second mask bevel edge 516 of the second sidewall of the opening 517, for example.

Before forming the trench in the semiconductor substrate, the first mask bevel edge 516 of the opening 517 of the mask layer 411 may be connected to (or e.g. may abut, or e.g. may be adjacent to) the first vertical portion 514 of the opening 517 of the mask layer 411, for example. The second mask bevel edge 516 of the opening 517 of the mask layer 411 may be connected to (or e.g. may abut, or e.g. may be adjacent to) the second vertical portion 514 of the opening 517 of the mask layer 411, for example.

The portion 518 of the first lateral surface 412 of the semiconductor substrate 102 which is uncovered by the mask layer 411 may be located laterally between the first mask bevel edge 516 of the opening 517 of the mask layer 411 and the second mask bevel edge 516 of the opening 517 of the mask layer 411, for example.

As shown in FIG. 5D, the method 500 may further include etching 320 at least a part of the mask layer and the semiconductor substrate simultaneously during the same etching process to form the trench 201 extending into the semiconductor substrate 102. The (simultaneous) etching process for etching the semiconductor substrate and at least the part of the mask layer may continue after the mask bevel edge of the opening is removed (e.g. etched away) from the semiconductor substrate.

The first sidewall 103 of the trench 201 formed in the semiconductor substrate 102 by the etching process may include a first vertical portion 534. The first sidewall 103 of the trench 201 may further include a first bevel portion 104 based on a reproduction of the first mask bevel edge 516 of the mask layer 411 in the semiconductor substrate 102.

The opposite second sidewall 103 of the trench 201 formed in the semiconductor substrate by the etching process may include a second vertical portion 534. The second sidewall of the trench 201 may further include a second bevel portion 104 based on a reproduction of the second mask bevel edge 516 of the mask layer 411 in the semiconductor substrate 102.

If the hard mask is executed in two stages, a reduction in angle (e.g. instead of an inclined trench wall) may also be achieved at the trench floor. Following the depositing of the hard mask 411, a step is etched into the hard mask 411 in the area of the subsequent trench to be formed (FIG. 5A). In the thinned area of the hard mask 411, a masked etching (FIG. 5B) and a damage implantation with Ar ions may be carried out, and the hard mask 411 may be chamfered using a wet-chemical etching (FIG. 5C). Using the mask (as illustrated in FIGS. 5A to 5C), the trench 201 may be etched (as shown in FIG. 5D). Optionally, in case of a BPSG hard mask, a flowing step may be carried out, instead of a damage implantation and subsequent etching, in order to round off the edge of the BPSG.

More details and aspects are mentioned in connection with the embodiments described above or below. The embodiments shown in FIGS. 5A to 5D may each comprise one or more optional additional features corresponding to one or more aspects mentioned in connection with the proposed concept or one or more embodiments described above (e.g. FIGS. 1 to 4C) or below.

Various examples relate to a method for forming bevel trenches to reduce field strength.

Aspects and features (e.g. the semiconductor device, the gate trench, the at least one transistor structure, the sidewall, the bevel portion of the sidewall, the angle between the bevel portion and the bottom of the gate trench, the lateral dimension of the bevel portion, the active region of the semiconductor substrate, the mask layer, the at least one trench of the mask layer, the first trench of the mask layer, the second trench of the mask layer, the edge portion of the mask layer, the mask bevel edge of the trench of the mask layer, structuring the mask layer, etching at least a part of the mask layer, modifying the edge portion of the mask layer) mentioned in connection with one or more specific examples may be combined with one or more of the other examples.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g. digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A method for forming a semiconductor device, the method comprising:
depositing a mask layer on a lateral surface of a semiconductor substrate;
structuring the mask layer after depositing to form an opening in the mask layer, wherein the structuring comprises reforming an edge side of the mask layer that faces the opening and is perpendicular to the lateral surface into a mask bevel edge that is angled relative to the lateral surface; and
etching at least a part of the mask layer and the semiconductor substrate during the same etching process to form a trench within an active region of a semiconductor substrate extending into the semiconductor substrate,
wherein the trench comprises a width of less than 10 μm, and
wherein a sidewall of the trench formed by the etching process comprises a bevel portion based on a reproduction of the mask bevel edge of the mask layer in the semiconductor substrate.

2. The method of claim 1, wherein structuring the mask layer comprises:
incorporating ions into an edge portion of the mask layer; and
etching the edge portion of the mask layer to form the mask bevel edge of the opening.

3. The method of claim 1, wherein structuring the mask layer comprises:
etching a plurality of trenches into the edge portion of the mask layer; and varying at least one of a trench width of the plurality of trenches of the edge portion of the mask layer and a distance between the plurality of trenches of the edge portion of the mask layer.

4. The method of claim 1, wherein structuring the mask layer comprises:
annealing the mask layer above a reflow temperature of the mask layer so that an edge portion of the mask layer is modified to form the mask bevel edge of the opening.

5. The method of claim 1, wherein structuring the mask layer comprises:
etching a first portion of the mask layer to form a first trench in the mask layer; and
etching a second portion of the mask layer at a bottom of the first trench of the mask layer to form a second trench below the first trench.

6. The method of claim 5, wherein structuring the mask layer further comprises:
modifying a first edge portion of the mask layer at a first sidewall of the second trench of the mask layer to form a first mask bevel edge of the opening; and
modifying a second edge portion of the mask layer at an opposite second sidewall of the second trench of the mask layer to form a second mask bevel edge of the opening.

7. The method of claim 6, wherein a bevel angle of the first mask bevel edge of the opening and a bevel angle of the second mask bevel edge of the opening are different from each other.

8. The method of claim 1, wherein structuring the mask layer comprises:
structuring a photoresist layer formed on the mask layer by greyscale lithography to uncover at least part of the mask layer to be modified.

9. The method of claim 1, further comprising:
annealing the semiconductor substrate after etching at least a part of the mask layer and the semiconductor substrate and after removing the mask layer formed at the semiconductor substrate.

10. The method of claim 1, wherein the mask layer is structured such that a first one of the edge portions of the mask layer remains substantially perpendicular to the lateral surface after the structuring and such that a second one of the edge portions that faces the first edge portion is oriented at an obtuse angle relative to the lateral surface of the semiconductor substrate after the structuring.

11. The method of claim 10, wherein an angle between the bevel portion and the lateral surface of the semiconductor substrate is between 110° and 160°.

12. The method of claim 1, wherein structuring the mask layer comprises:
etching a first opening in the mask layer after depositing a mask layer, the first opening comprising a bottom surface that is vertically spaced apart from a lateral surface of the semiconductor substrate;
etching a second opening in the bottom surface of the mask layer after etching the first opening, the second opening extending to the lateral surface of the semiconductor substrate and comprising the two edge portions of the mask layer that are substantially perpendicular to the lateral surface; and
modifying a first edge portion of the second opening to form the first mask bevel edge.

* * * * *